US008691493B2

(12) United States Patent
Brehm et al.

(10) Patent No.: US 8,691,493 B2
(45) Date of Patent: Apr. 8, 2014

(54) METHOD FOR THE PRODUCTION OF A MULTILAYER ELEMENT, AND MULTILAYER ELEMENT

(75) Inventors: Ludwig Brehm, Adelsdorf (DE); Rene Staub, Hagendorn/Schweiz (CH)

(73) Assignee: Leonhard Kurz & Stiftung & Co. KG, Furth (DE)

( * ) Notice: Subject to any disclaimer, the term of this patent is extended or adjusted under 35 U.S.C. 154(b) by 121 days.

(21) Appl. No.: 13/383,635

(22) PCT Filed: Jul. 13, 2010

(86) PCT No.: PCT/EP2010/004251
§ 371 (c)(1), (2), (4) Date: Mar. 1, 2012

(87) PCT Pub. No.: WO2011/006634
PCT Pub. Date: Jan. 20, 2011

(65) Prior Publication Data

US 2012/0156446 A1 Jun. 21, 2012

(30) Foreign Application Priority Data

Jul. 17, 2009 (DE) ........................ 10 2009 033 762

(51) Int. Cl.
*G03F 7/20* (2006.01)

(52) U.S. Cl.
USPC ........................................................ 430/311

(58) Field of Classification Search
USPC ......................................... 430/311, 322, 313
See application file for complete search history.

(56) References Cited

U.S. PATENT DOCUMENTS

| | | | |
|---|---|---|---|
| 6,521,688 B1 | 2/2003 | Linzmeier et al. |
| 8,053,146 B2 | 11/2011 | Staub et al. |
| 2004/0265552 A1 | 12/2004 | Lutz et al. |
| 2005/0118537 A1 | 6/2005 | Lutz et al. |
| 2005/0142342 A1 | 6/2005 | Lutz et al. |
| 2005/0181498 A1 | 8/2005 | Lutz et al. |

FOREIGN PATENT DOCUMENTS

| | | |
|---|---|---|
| CA | 2294235 | 12/1998 |
| EP | 0797511 | 8/1999 |
| EP | 0991523 | 10/2002 |
| WO | WO03039888 | 5/2003 |
| WO | WO03095225 | 11/2003 |
| WO | WO03095226 | 11/2003 |
| WO | WO03095745 | 11/2003 |
| WO | WO2006084686 | 8/2006 |

*Primary Examiner* — Brittany Raymond
(74) *Attorney, Agent, or Firm* — Hoffmann & Baron, LLP

(57) ABSTRACT

The invention relates to a method for producing a multilayer element (100), and also to a multilayer element (100) produced by said method. On and/or in a carrier ply (1) a decorative ply (3) is formed. The decorative ply (3) has a first region (8) and a second region (9). Viewed perpendicular to the plane of the carrier ply (1), the decorative ply (3) has in the first region (8) a first transmittance and in the second region (9) a second transmittance greater in comparison to the first transmittance. A layer (5) to be structured and a photoactivatable resist layer are disposed on the first side (11) of the carrier ply (1). On exposure of the resist layer through the decorative ply (3), the decorative ply (3) serves as an exposure mask. The at least one layer (5) to be structured and the resist layer are structured in register to one another by means of structuring operations synchronized with one another.

17 Claims, 11 Drawing Sheets

METHOD FOR THE PRODUCTION OF A MULTILAYER ELEMENT, AND MULTILAYER ELEMENT

This application claims priority based on an International Application filed under the Patent Cooperation Treaty, PCT/EP2010/004251, filed on Jul. 13, 2010, and German Application No. DE 102009033762.8-45, filed on Jul. 17, 2009.

BACKGROUND OF THE INVENTION

The invention relates to a method for producing a multilayer element having a carrier ply and a single-layer or multilayer decorative ply formed on and/or in the carrier ply, and also to a multilayer element obtainable accordingly.

Optical security elements are frequently used in order to hinder the copying of documents or products in order to prevent their misuse. Thus optical security elements find use in securing documents, bank notes, credit cards, money cards, identity papers, high-value product packaging and the like. Known in these contexts is the use of optically variable elements as optical security elements which cannot be duplicated by conventional copying methods. Also known is the furnishing of security elements with a structured metal layer which is designed in the form of a text, logo or some other pattern.

Generating a structured metal layer from a metal layer applied two-dimensionally by sputtering or vapor deposition, for example, requires a multiplicity of operations, particularly if the intention is to generate fine structures which exhibit high anticounterfeit security. Thus it is known, for example, that a metal layer applied over the full area can be partially demetallized and thereby structured by means of positive or negative etching or by means of laser ablation. As an alternative to this it is possible to apply metal layers already in structured form to a carrier, by use of vapor deposition masks.

The greater the number of manufacturing steps in the production of the security element, the greater the importance accorded to the register accuracy of the individual method steps, i.e., the accuracy in positioning of the individual tools relative to one another during the formation of the security element, in relation to structures or layers or features already present on the security element.

SUMMARY OF THE INVENTION

It is an object of the present invention to specify a multilayer element which is particularly difficult to reproduce; and a method for producing such a multilayer element, in which a partially shaped layer is shaped in register with another partially shaped layer.

The object is achieved by means of a method for producing a multilayer element, in which a) on and/or in a carrier ply having a first side and a second side, a single-layer or multilayer decorative ply having a first region and a second region is formed, the decorative ply, viewed perpendicular to the plane of the carrier ply, having in the first region a first transmittance and in the second region a second transmittance greater in comparison to the first transmittance, said transmittances relating to electromagnetic radiation having a wavelength suitable for photoactivation, b) at least one layer to be structured is disposed on the first side of the carrier ply, c) a resist layer which can be photoactivated by means of said electromagnetic radiation is disposed on the first side of the carrier ply in such a way that the resist layer is disposed on the side of the at least one layer to be structured that is remote from the carrier ply, and the decorative ply is disposed on the other side of the at least one layer to be structured, d) the resist layer is exposed from the second side of the carrier ply by means of said electromagnetic radiation, the decorative ply serving as an exposure mask through the design of the first region and of the second region, and e) the at least one layer to be structured and the resist layer are structured in register with one another by means of structuring operations synchronized with one another.

Steps a) to e) of the method of the invention are to be performed preferably in the order stated. In the case of the exposure of the photoactivatable layer by means of said electromagnetic radiation from the side of the carrier ply that is remote from the photoactivatable layer, through the decorative ply, the decorative ply, which defines the first region and the second region, acts as an exposure mask, since the first region has a transmittance which is reduced relative to the transmittance of the second region.

A method of this kind allows the formation of particularly forgeryproof multilayer elements. As already mentioned, in the method, during the production of the multilayer element, the decorative ply serves as an exposure mask for an exposure, i.e., a photoactivation, of the photoactivatable resist layer, and on the completed multilayer element it serves for decoration. The decorative ply therefore fulfills a plurality of entirely different functions. The design of the decorative ply is more particularly such that a viewer of an article decorated by means of the multilayer element is able to view the at least one structured layer through the decorative ply. The typical transmission of the first regions of the decorative ply, therefore, is greater by at least one order of magnitude than the typical transmission of a conventional exposure mask, made of metal, for example. As a result of the use of the decorative ply as an exposure mask, the resist layer is structured in register with the first and second regions of the decorative ply—that is, the structures of the structured resist layer are disposed in register to the first and second regions of the decorative ply. Furthermore, in accordance with the method of the invention, the at least one layer to be structured is structured in register with the resist layer. The method therefore allows the formation of at least three layers formed in register with one another: the decorative ply, the resist layer, and the at least one layer to be structured. By means of the structuring step e) the at least one layer to be structured is formed as a structured layer. As a result of the method, the multilayer element has the structured layer in precise register in the first region or in the second region of the decorative ply. By register or register accuracy is meant the positionally exact disposition of layers lying one above another. The register fidelity or register accuracy of the layers is monitored preferably by means of register marks or registration marks, which are present equally on all layers and from which, preferably by means of optical recognition methods or sensor technology, it is readily possible to detect whether the layers are disposed in register. Register accuracy exists in both dimensions, i.e. length and width, of the layers.

By register is meant the precise fit on one another or over one another of different components of the multilayer element. A ply comprises at least one layer. A decorative ply comprises one or more decorative and/or protective layers, formed particularly as coating layers. The decorative layers may be disposed over the full area or in pattern-structured form on the carrier ply. The one or more decorative layers here may be disposed on one side or on both sides of the carrier ply, which is formed, for example, as a base film or carrier film. The decorative ply comprises at least one layer which attenuates the electromagnetic radiation having the wavelength suitable for photoactivation. In relation to the electromagnetic radiation having the wavelength suitable for photoactivation, the decorative ply has an optical density of greater than zero.

As a result of the design of the exposure mask as a decorative ply, there is automatically an absolutely 100% register accuracy of the exposure mask relative to the decorative ply—that is, the decorative ply itself acts at least regionally as the exposure mask. The decorative ply and the exposure mask, then, form a conjoint functional unit. As a result of the both simple and effective method of the invention, the present invention affords a considerable advantage over conventional processes in which a separate exposure mask must be brought into register with the decorative ply, there being very few cases in practice where register deviations can be avoided entirely.

Through the present invention, therefore, the layer to be structured can be structured in register with the first and second regions, defined by the decorative layer, without additional technological cost and complexity. In conventional processes for generating an etch mask by means of mask exposure, with the mask being present either as a separate unit, e.g., as a separate film or as a separate glass plate/glass roll, or as a layer applied subsequently by printing, the problem may arise that linear and/or nonlinear distortions brought about by prior operating steps, more particularly those involving thermal and/or mechanical stress, in the multilayer element cannot be compensated completely, over the entire area of the multilayer element, by orientation of the mask on the multilayer element, despite mask orientation taking place on existing register marks which are disposed preferably on the horizontal and/or vertical edges of the multilayer element. The tolerance here fluctuates in a comparatively large range over the entire area of the multilayer element. With the method of the invention, the first and second regions, defined by the decorative layer, are utilized as a mask, with the parts of the decorative layer that define the first and second regions being applied in an early operating step during the production of the multilayer element. The mask formed as a decorative layer, therefore, is subject to all of the subsequent operating steps of the multilayer element, and so automatically follows all of any distortions in the multilayer element itself that may be brought about by these operating steps. As a result, there may be no additional tolerances, more particularly no additional tolerance fluctuations, occurring over the area of the multilayer element, since the subsequent generation of a mask and the associated need for extremely register-accurate subsequent positioning of this mask, which is independent of the course of the operation up until that point, is avoided. The tolerances or register accuracies in the case of the method of the invention lie only in possibly not absolutely exactly formed edges of the first and second regions, the quality of which is determined by the particular production method employed. The tolerances and register accuracies in the case of the method of the invention are situated, for instance, in the micrometer range, and therefore well below the resolution capacity of the eye; that is, the naked human eye is no longer able to perceive any tolerances present.

In the case of the exposure of the resist layer from the second side of the carrier ply, in accordance with the invention, the resist layer is exposed to regionally different degrees. This differing exposure of the resist layer is governed by the different transmittances in the first and second regions of the decorative ply, but is independent of any relief structure present, and more particularly is independent of any relief structure impressed in the carrier film or in a layer disposed on the carrier film. In other words, the differing exposure of the resist layer is not governed by a relief structure.

The structuring of the at least one layer to be structured and of the photoactivatable resist layer, which is disposed on the first side of the carrier ply, is determined by the different degrees of exposure of the resist layer, which is defined in turn by the first and second regions of the decorative ply; the structuring, however, is independent of any relief structure that may be present, and is not governed by a relief structure, being independent more particularly of any relief structure impressed in the carrier film or in a layer disposed on the carrier film. Viewed perpendicular to the plane of the carrier ply, therefore, the boundaries of the first and second regions of the decorative ply correspond with register accuracy to the boundaries of the structuring of the at least one layer to be structured and of the photoactivatable resist layer, that are independent of and not governed by boundaries, more particularly contours, of a relief structure.

In accordance with step d) of the method of the invention, the decorative ply, as a result of the design of the first region and of the second region, serves as an exposure mask, with the exposure mask thus formed being independent of any relief structure that may be present, more particularly independent of any relief structure impressed in the carrier film or in a layer disposed on the carrier film. In accordance with step e) of the method of the invention, the at least one layer to be structured and the resist layer are structured in register with one another by means of structuring operations synchronized with one another, this structuring being dependent on the first and second regions of the decorative ply, but independent of any relief structure that may be present, more particularly independent of any relief structure impressed in the carrier film or in a layer disposed on the carrier film.

The function of the decorative ply as an exposure mask is independent of the layer to be structured. The physical properties, more particularly the effective thickness or the optical density, of the layer to be structured have no influence on and are independent of the physical properties of the decorative ply, i.e. of the exposure mask, more particularly of the transmittances in the first and second regions of the decorative ply. The decorative ply, alone and detached from any relief structures present, more particularly defractive relief structures, and from other properties, more particularly physical and/or chemical properties, of the layer to be structured, determines the exposure mask of the invention. The layer to be structured is not part of the exposure mask—that is, in the case of the present invention, the exposure mask (i.e., decorative ply) and the layer to be structured are present separately and are functionally decoupled.

It is possible for the at least one layer to be structured to have a constant layer thickness over the whole area on which it is disposed on the first side of the carrier ply.

It is possible for the decorative ply to comprise a first coating layer which is disposed in the first region with a first layer thickness and in the second region either not or with a second layer thickness smaller in comparison to the first layer thickness on the carrier ply, so that the decorative ply has said first transmittance in the first region and said second transmittance in the second region.

It is possible for the decorative ply to comprise a first coloration of the carrier ply, which is formed in the first region with a first layer thickness and in the second region either not or with a second layer thickness smaller in comparison to the first layer thickness, so that the decorative ply has said first transmittance in the first region and said second transmittance in the second region. The coloration of the carrier ply may be formed as a colored or discolored region within the carrier ply. One preferred method for forming a coloration of the carrier ply is a laser marking in the carrier ply with color change, or a method in which pigments or dyes are caused to diffuse into the carrier ply.

One example of laser marking in the form of a blackening or darkening of a carrier ply is the action of a laser beam on a carrier ply made, for example, of polycarbonate (=PC), this being particularly effective when the polycarbonate is doped. Carrier plies of this kind are described in EP 0 991 523 B1 or EP 0 797 511 B1, for example.

One example of a method for the inward diffusion of pigments or dyes is the printing of the carrier ply with a solvent-borne color coating material, the subsequent temporal contacting of the color coating material, and the subsequent wash removal of the color coating material. As a result of the solvent or solvents in the color coating material, the surface of the carrier ply material is partly attacked, allowing parts of the color coating material to diffuse at least into the upper carrier ply layers, situated in the region of the attacked surface. The carrier ply material should for this purpose be selected such that it can be attacked by a solvent used in the color coating material. One such combination, for example, may be a carrier ply made of polycarbonate and a color coating material based on aromatic solvents. Following removal of the color coating material, the inwardly diffused constituent of the color coating material remains in the carrier ply. Depending on the layer thickness of the applied color coating material and on the selection of the carrier ply material, different amounts of pigments or dyes may diffuse to different depths into the carrier ply. The inward diffusion does produce a slight lack of definition at the margins of the first and/or second regions but the horizontal extent of this lack of definition lies only in the region of the preferably vertical layer thickness of the printed-on color coating material. In this context, "vertical" refers to an extent substantially perpendicular to the carrier ply, and "horizontal" to an extent substantially in the plane formed by the carrier ply. If, for example, a color coating layer of a few micrometers, e.g., 1 to 10 μm is applied by printing in a printing process, the lack of definition also lies only in this region from 1 to 10 μm, and hence well below the resolution capacity of the eye.

Another example of a method for the inward diffusion of pigments or dyes is the regional printing of a carrier ply with a liftoff coating material for masking the second regions. The carrier ply is subsequently exposed to an atmosphere containing a vaporized colorant, such as, for example, an atmosphere comprising an inert gas such as argon or nitrogen and vaporized iodine. In the first regions, not covered by the liftoff coating material, the vaporized colorant then diffuses into the carrier ply. The liftoff coating material can be subsequently removed. Alternatively, or else in combination with this, the carrier ply printed regionally with the liftoff coating material may travel through a bath, containing, for example, apolar solvents such as toluene or benzine, and a dye dissolved therein, and preferably a UV blocker (UV=ultraviolet) likewise in solution in the bath. In this case, the liftoff coating material must be resistant to the solvents of the bath, in the form of a water-soluble liftoff coating material, for example. The dye and, where appropriate, the UV blocker diffuse into the first carrier ply regions, not covered by the liftoff coating material, in the bath, and thereby color the carrier ply. The liftoff coating material can be subsequently removed from the carrier ply.

Another example of a method for the inward diffusion of pigments or dyes is the printing of the carrier ply by means of a thermal sublimation process, in which dye is sublimed, i.e., evaporated, from a separate color carrier ply by means of local heat exposure through a thermal printing head. This color vapor is then able to diffuse into the carrier ply, with the possibility of obtaining high resolutions of around 300 dpi (=dots per inch). In order to increase further the edge definition on inward diffusion, it is possible to use an additional mask, which is disposed between thermal printing head and carrier ply and which masks regions of the carrier ply that are not to be colored.

It is possible for a layer of the decorative ply to be formed regionally in different layer thicknesses on and/or within the carrier ply. It is possible for a layer of the decorative ply to be formed as a layer having substantially uniform thickness, and for the layer to be formed only regionally, i.e., in pattern-structured form, on and/or within the carrier ply. In this context it is possible for the decorative ply to comprise layers applied only on one side of the carrier ply, or layers applied on both sides of the carrier ply.

The object is further achieved by means of a multilayer element having a carrier ply which has a first side and a second side, and a single-layer or multilayer decorative ply formed on and/or in the carrier ply, the decorative ply having a first region and a second region and, viewed perpendicular to the plane of the carrier ply, having in the first region a first transmittance and in the second region a second transmittance greater in comparison to the first transmittance, said transmittances relating to electromagnetic radiation having a wavelength suitable for photoactivation, the multilayer element also having at least one layer which is structured in register to the first region and the second region.

The multilayer element of the invention can be used, in the form of a label, laminating film, hot-stamping film or transfer film, for example, for the provision of an optical security element which is employed for securing documents, bank notes, credit cards, money cards, identity papers, high-value product packaging and the like. Here, the decorative ply and the at least one structured layer disposed in register therewith may serve as an optical security element.

Where, below, a disposition of an article in the first region and/or in the second region is described, this should be taken to mean that the article is disposed such that the article and the first and/or second region(s) of the decorative ply overlap, as viewed perpendicular to the plane of the carrier ply. Also, below, the terms "first region" and "second region", on the basis of the decorative ply, are also transposed to other articles, e.g. layers/plies of the multilayer element. A first/second region of an article means that the first/second region of the decorative ply and the first/second region of the article are congruent, as viewed perpendicular to the plane of the carrier ply.

The exposure mask formed by the decorative ply comprises the first region and the second region, which have different transmittances in relation to the radiation used for the exposure. The exposure mask therefore does not have a region which is absolutely opaque to the radiation used for the exposure, but instead only a region having a higher transmittance and a region having a lower transmittance, and may therefore be referred to as a halftone mask. The region of the photoactivatable layer that is exposed through the first region is activated to a lower degree than the region of the photoactivatable layer that is exposed through the second region, since the first region possesses a lower transmittance than the second region.

It has been found appropriate if the photoactivatable layer is formed using a positive photoresist, whose solubility increases on activation by exposure, or a negative photoresist, whose solubility decreases on activation by exposure. Exposure is the term for the selective irradiation of a photoactivatable layer through an exposure mask with the aim of producing local changes in the solubility of the photoactivatable layer as a result of a photochemical reaction. According to the nature of the change in solubility that is achievable photochemically, a distinction is made between the following photoactivatable layers, which may be designed as photoresists: in the case of a first type of photoactivatable layers (e.g., negative resist), their solubility decreases by exposure in comparison to unexposed regions of the layer, because, for example, the light leads to hardening of the layer; in the case of a second type of photoactivatable layer (e.g. positive resist), their solubility increases by exposure in comparison to unexposed regions of the layer, because, for example, the light leads to the decomposition of the layer.

It has been found appropriate, furthermore, if the resist layer is removed in the second region, when using a positive photoresist, or in the first region, when using a negative photoresist. This can be accomplished by means of a solvent such as an alkali or acid. When a positive photoresist is used, the more highly exposed second region of the resist layer has a higher solubility than the less exposed first region of the resist layer. Consequently, a solvent dissolves the material of the resist layer, i.e., the positive photoresist disposed in the second region, more rapidly and more effectively than the material of the resist layer disposed in the first region. Through the use of a solvent, therefore, it is possible to structure the resist layer—that is, the resist layer is removed in the second region, but remains intact in the first region.

It has been found appropriate if the layer to be structured is removed in the first or second regions in which the resist layer has been removed. This can be accomplished by means of an etchant such as an acid or alkali. It is preferred if the regional removal of the resist layer in the first or second region and of the regions thereby laid bare in the first or second region, of the layer to be structured, are accomplished in the same method step. This can be achieved in a simple way by means of a solvent/etchant such as an alkali or acid which is capable of removing not only the resist layer—in the exposed region in the case of a positive resist or in the unexposed region in the case of a negative resist—but also the layer to be structured—i.e., which attacks both materials. In this case the resist layer must be of a form such that it withstands the solvent or etchant used for removing the layer to be structured, in the unexposed region when using a positive resist and in the exposed region when using a negative resist, for at least a sufficient time, i.e., for the solvent or etchant contact time.

One preferred embodiment envisages the removal of the resist during the workstep for removing the layer to be structured, in the first or second region, or in a separate, subsequent, later workstep, this removal being likewise largely complete (and known as "stripping"). In this case, by reducing the number of layers situated one above another in the multilayer element, it is possible to increase the robustness and durability of said element, since adhesion problems between adjacent layers are minimized. Moreover, the optical appearance of the multilayer element can be improved, since, following removal of the resist, which in particular may be colored and/or not completely transparent, but instead only translucent or opaque, the underlying regions lie free again. For specific applications without particularly exacting requirements in terms of the robustness or the optical appearance, however, it is also possible to leave the resist on the structured layer. Leaving the resist on the structured layer may be advantageous particularly when it is configured as a relatively stable negative resist and has been colored. For this purpose the resist may also be printed with two or more colors. Accordingly, different color impressions are produced when the multilayer element is viewed from different sides.

It is preferred if the resist layer is exposed from the side of the carrier ply remote from the resist layer, by means of said electromagnetic radiation, with the decorative ply, as a result of the design of the at least one first region and of the at least one second region, serving as an exposure mask. The at least one layer to be structured is structured in register with the at least one first region and with the at least one second region, by means of the photoactivatable layer removed in the at least one first region or the at least one second region after the exposing.

It is preferred if the resist layer comprises a UV-activatable material. In this case UV radiation can be used for exposure step d). As a result, the visual properties of the multilayer element can be separated from the desired operational properties for the structuring of the at least one layer to be structured. Exposure step d) is designed such that the radiation completely penetrates the resist layer, in other words reaching through to its outer surface, remote from the carrier ply. Only then is it readily possible to use a solvent to remove the resist from the side of the outer surface of the resist layer. If the resist is not irradiated through completely, it generally still has a "skin" on its outer surface, remote from the carrier ply, which at least partly prevents the attack of a solvent.

The carrier ply must be transparent to the radiation used in exposure step d). For exposure it has been found appropriate to use electromagnetic radiation having a radiation maximum in the region of 365 nm, since in this region PET (polyethylene terephthalate), which may form a substantial constituent of the carrier ply, is transparent. In the region of this wavelength is located the maximum of the emission of a high-pressure mercury lamp. In the case of the following carrier materials it is also possible to use electromagnetic radiation having a wavelength in the range from 254 to 314 nm: olefinic carrier material such as PP (polypropylene) or PE (polyethylene), PVC-based and PVC copolymer-based carrier material, carrier material based on polyvinyl alcohol and polyvinyl acetate, and polyester carriers based on aliphatic raw materials.

It has emerged as being advantageous to select the thickness and the material of the decorative ply in such a way that the first transmittance is greater than zero. The thickness and the material of the decorative ply are selected such that electromagnetic radiation having the wavelength suitable for photoactivation partly penetrates the decorative ply in the first region. Accordingly, the exposure mask formed by the decorative ply is radiation-transparent in the first region.

It has been found appropriate for the thickness and the material of the decorative ply to be selected such that the ratio between the second and first transmittances is greater than or equal to two. The ratio between the first and second transmittances is preferably 1:2, also referred to as contrast 1:2. A contrast of 1:2 is smaller by at least one order of magnitude than for conventional masks. Hitherto it was not customary to use a mask with such a low contrast like the decorative ply described here for exposing a resist layer. In the exposure of a resist using a conventional mask (e.g. a chromium mask), there are opaque regions, i.e., regions with OD>2, and completely transparent regions; the mask, therefore, exhibits a high contrast. A conventional aluminum mask has a typical contrast of 1:100, since the typical transmittance of an aluminum layer is located at values around 1%, corresponding to an optical density (OD) of 2.0. The transmittance (T) and the OD are linked to one another as follows: $t=10^{-OD}$ (i.e. OD=0 corresponds to T=100%; OD=2 corresponds to T=1%; OD=3 corresponds to T=0.1%). In contrast to conventional exposure processes, in the case of the present invention the resist layer is exposed not only through a low-contrast mask (i.e., decorative ply) but also through the layer to be structured.

It is additionally possible for at least one functional layer, more particularly a detachment layer and/or a protective coating layer, to be disposed between the carrier ply and the at least one layer to be structured, preferably directly on the first side of the carrier ply. This is advantageous particularly when using the multilayer film as a transfer film, where the functional layer enables trouble-free detachment of the carrier ply from a transfer ply comprising at least one layer of the decorative ply and the structured layer.

It has been found appropriate for the thickness and the material of the decorative ply to be selected such that the electromagnetic radiation, measured after one pass through a layer stack consisting of the carrier ply, the at least one functional layer, and the decorative ply, has a transmittance of around 0.3 in the first region and a transmittance of around 0.7 in the second region. A contrast of this kind between the two regions designed as different transmission regions, i.e., the first region and the second region, is sufficient particularly in the case of a positive resist layer.

It is possible for at least one relief structure to be formed on the first side of the carrier ply and for the at least one layer to be structured to be disposed on the surface of the at least one relief structure. For this purpose, consideration may be given to disposing a replicating layer on the first side of the carrier ply and embossing the at least one relief structure into a surface of the replicating layer that is remote from the carrier ply. Consideration may also be given, however, to embossing the at least one relief structure directly into the carrier ply. In that case the carrier ply must have a replicatable carrier material suitable for a replicating process on the first side of the carrier ply, an example of such material being PVC (polyvinyl chloride), PC, PS (polystyrene) or PVA (polyvinyl acetate). A replicating layer, generally speaking, is a layer which can be produced superficially with a relief structure. The term includes, for example, organic layers such as polymeric layers or coating layers, or inorganic layers such as inorganic plastics (e.g., silicones), glass layers, semiconductor layers, metal layers, and so on, and also combinations thereof. It is preferred for the replicating layer to be formed as a replicating coating layer. To form the relief structure, a radiation-curable replicating layer can be applied to the carrier ply, a relief impressed into the replicating layer, and the replicating layer cured with the relief embossed therein. It is preferred if the relief is formed as a light-diffracting or light-refracting or light-scattering, microscopic or macroscopic structure, such as a diffractive structure or a diffraction grating or a matt structure, or combinations of light-diffracting or light-refracting or light-scattering, microscopic or macroscopic structures, such as diffractive structures, matt structures or diffraction gratings.

It is possible for the at least one relief structure to be disposed at least partly in the first region and/or in the second region. The area layout of the relief structure in this case may be adapted to the area layout of the first and second regions, and more particularly may be designed in register therewith, or, for example, the area layout of the relief structure is formed as a continuous, infinite pattern independently of the area layout of the first and second regions. As a result of the inventive disposition of the resist layer on the first side of the carrier ply in such a way that the resist layer is disposed on the side of the at least one layer to be structured that is remote from the carrier ply and the decorative ply is disposed on the other side of the at least one layer to be structured, it is possible for the layer to be structured to be disposed at least partly on a relief structure, in contrast to structuring processes using washcoat material. In a conventional structuring process using washcoat material comprising silica (silicon dioxide) or titanium dioxide (e.g., rutile), the silica and the titanium dioxide act destructively, by mechanical exposure, on the surface of the replicating roll, especially with a nickel surface.

Furthermore, the differences in level between the washcoat layer and the underlying layer into which the relief structure is to be embossed are also a hindrance to replication.

It is possible for a compensating layer to be applied on the first side of the carrier ply after step e). The structuring step e) forms the layer to be structured as a structured layer. It is preferred if after step e) the structured layer and the resist layer is removed in the first or second region and present in the other region. Through application of the compensating layer it is possible for indented regions/indentations of the structured layer to be at least partly filled. Through application of the compensating layer it is possible as well for indented regions/indentations of the resist layer to be at least partly filled. The compensating layer may comprise one or more different layer materials. The compensating layer may be designed as a protective and/or adhesive and/or decorative layer. It is possible for an adhesion promoting layer, e.g., adhesive layer, to be applied to the side of the compensating layer that is remote from the carrier ply. Accordingly, the multilayer element in the form of a laminating film or transfer film can be joined to a substrate adjoining the adhesion promoting layer, in—for example—a hot-stamping or IMD process (IMD=In-Mold Decoration). The substrate may be, for example, paper, card, textile or another fiber material, or a plastic, and may be flexible or predominantly rigid.

It is possible for at least one layer of the decorative ply to be applied on the second side of the carrier ply. By this means it is possible for one or more layers of the at least one layer to be removed again after the exposure step, in which the decorative ply serves as an exposure mask. It is therefore possible for one or more layers of the at least one layer of the decorative ply that is applied on the second side of the carrier ply to be removed from the carrier ply again after exposure step d).

It is preferred if the decorative ply is at least partly transparent to visible light having a wavelength in a range from approximately 380 to 750 nm. It is possible, if the decorative ply is colored with at least one opaque and/or at least one transparent colorant which at least in one wavelength range of the electromagnetic spectrum is colored or color-generating, more particularly is chromatically colored or chromatically color-generating, more particularly if the decorative ply comprises a colorant which can be excited outside the visible spectrum and generates a visually perceptible colored impression. It is possible for the decorative ply to be colored with at least one pigment or at least one colorant of the color cyan, magenta, yellow or black (CMYK=Cyan Magenta Yellow Key; key: black as depth of color) or of the color Red, Green or Blue (RGB), more particularly for the purpose of generating a subtractive mix color, and/or to be provided with at least one red and/or green and/or blue fluorescent, radiation-excitable pigment or dye and thereby, more particularly for an additive mix color to be generated on irradiation. This coloring may be largely constant over the entire colored area region or else to be formed as a color profile which more particularly is continuous, an example being a linear or radial color profile, in other words for the coloration to have a gradient, it being possible for the coloration to vary more particularly between two or more hues, for example, from red to blue and further to green, or between one or more hues and an achromatic, for example, between red and transparent, i.e., an uncolored decorative ply. Color profiles of these kinds are known and widespread in security printing because it is difficult for them to be counterfeited.

As a result, the decorative ply performs a dual function. On the one hand, the decorative ply acts as an exposure mask for forming at least one structured layer which is disposed in register with the first and second regions of the decorative ply. The decorative ply serves more particularly as an exposure mask for a regional demetallization of a metal layer. On the other hand the decorative ply, or at least one or more layers of the decorative ply, on the multilayer element serves as an optical component, more particularly as a single-color or multicolor color layer for a coloration of the at least one structured layer, in which case the color layer is disposed in register above and/or next to/adjacent to the at least one structured layer.

It is possible for the multilayer element in the first region or the second region to have a resist layer which can be photoactivated by means of said electromagnetic radiation, in which case the at least one structured layer and the resist layer are disposed in orientation with one another on the first side of the carrier ply in such a way that the resist layer is disposed on the side of the at least one structured layer that is remote from the carrier ply, and the decorative ply is disposed on the other side of the at least one structured layer.

It is possible for the decorative ply to comprise a first coating layer, which is disposed in the first region with a first layer thickness and in the second region either not or with a second layer thickness smaller in comparison to the first layer thickness, on the carrier ply, so that the decorative ply has said first transmittance in the first region and said second transmittance in the second region.

It is possible for the decorative ply to comprise a first coloration of the carrier ply which is formed in the first region with a first layer thickness and in the second region either not or with a second layer thickness smaller in comparison to the first layer thickness, so that the decorative ply has said first transmittance in the first region and said second transmittance in the second region.

It is preferred if the ratio between the second transmittance and the first transmittance is greater than two.

It is possible for at least one relief structure to be formed on the first side of the carrier ply and for the at least one layer to be structured to be disposed on the surface of the least one relief structure. In that case it is possible for a replicating layer to be disposed on the first side of the carrier ply and for the at least one relief structure to be embossed into a surface of the replicating layer that is remote from the carrier ply. It is also possible, however, for the at least one relief structure to be embossed into the carrier ply. It is possible for the relief structure to be formed as a diffractive relief structure. It is preferred if the at least at least one relief structure is disposed at least partly in the first region and/or in the second region.

It is possible for a compensating layer to be disposed on the side of the at least one structured layer that is remote from the carrier ply. It is preferred if the refractive index n1 of the compensating layer in the visible wavelength range is situated in the range from 90% to 110% of the refractive index n2 of the replicating layer. It is preferred if in the first or second regions in which the structured layer is removed and a three-dimensional structure, i.e. a relief, is formed on the surface, the indentations and elevations of the relief are evened out by means of a compensating layer which has a refractive index similar to that of the replicating layer, i.e., $\Delta n=|n2-n1|<0.3$. In this way the optical effect formed by the relief is no longer perceptible in the regions in which the compensating layer is applied directly to the replicating layer.

It is possible for the compensating layer to be formed as an adhesion layer, e.g., adhesive layer. It is possible for at least one layer of the decorative ply to be disposed on the second side of the carrier ply. It is possible for the decorative ply to comprise at least two coating layers which evoke different color impressions. It is possible for the decorative ply to comprise a first coating layer, which is applied only regionally on the carrier ply, and a second coating layer which is applied over the full area of the carrier ply.

It is possible for the at least one structured layer to comprise one or more of the following layers: metal layer, more particularly comprising copper, aluminum, silver and/or gold, HRI layer (HRI=High Refractive Index), more particularly comprising ZnS or $TiO_2$, liquid-crystal layer, polymer layer, more particularly conductive or semiconducting polymer layer, thin-film interference layer stack, pigment layer, semiconductor layer. The at least one structured layer is not confined to the exemplary embodiments stated. The layer to be structured may be any material which can be attacked, i.e., dissolved or removed, by a solvent or etchant. It is possible for the at least one structured layer to have a thickness in the range from 20 to 1000 nm, more particularly 20 to 100 nm. It is preferred that the structured layer of the multilayer element as a reflection layer for light incident from the side of the replicating layer. Through the combination of a relief structure of the replicating layer and a structured layer disposed beneath it, formed for example as a metal layer, it is possible to generate a multiplicity of different optical effects which can be used actively for security aspects. The structured layer may be made of metal, as for example aluminum or copper or silver, which in a subsequent method step is galvanically reinforced. The metal used for the galvanic reinforcement may be the same as or different from the metal of the structured layer. One example is the galvanic reinforcement of a thin silver layer with copper, for example.

It is possible for the resist layer to have a thickness in the range from 0.3 to 3 μm. It has been found appropriate if the resist layer is designed as an etch resist, in which case the resist layer, if it is designed as a positive photoresist, has a high resistance in the unexposed region and, if it is designed as a negative photoresist, has a high resistance in the exposed region, to an etchant which attacks the layer to be structured, this resistance being sufficient to prevent the access of the etchant to the layer to be structured, in the region covered by the resist layer, substantially, at least until the etchant has removed the layer to be structured in the desired region. Said desired region, if the resist layer is designed as a positive photoresist, is the exposed region, and, if the resist layer is designed as a negative photoresist, is the unexposed region.

It is possible for the decorative ply to have a thickness in the range from 0.5 to 5 μm. It is possible for the decorative ply to comprise dyes or highly disperse pigments, more particularly a Mikrolith® K pigment dispersion. This is advantageous particularly in the case of a colored decorative ply with pigment fraction. It is possible for UV absorbers to be added to the material forming the decorative ply, especially if said material comprises relatively few pigments or other UV-absorbing constituents. It is possible for the decorative ply to comprise inorganic absorbers having a high scatter fraction, more particularly nanoscaled UV absorbers based on inorganic oxides. Oxides which have proven suitable are, in particular, $TiO_2$ and Zno in highly disperse form, of the kind also used in sun protection creams with a high light protection factor. These inorganic absorbers lead to high scattering and are therefore suitable especially for a matt coloration, more particularly a satin-matt coloration, of the decorative ply. It is possible for the decorative ply to comprise organic absorbers, more particularly benzotriazole derivatives, having a mass fraction in the range from around 3% to 5%. Suitable organic absorbers are sold under the trade name Tinuvin® by the company Ciba, Basle, Switzerland. It is possible for the decorative ply to comprise fluorescent dyes or organic or inorganic, fluorescent pigments in combination with highly disperse pigments, more particularly Mikrolith® K. As a result of the excitation of these fluorescent pigments, the UV radiation is very largely filtered out by the decorative ply itself, with the consequence that only an insignificant fraction of the radiation reaches the resist layer. The fluorescent pigments may be used in the multilayer element as an additional security feature.

The use of a UV-activatable resist layer offers advantages: Through the use of a UV absorber which is transparent in the visual wavelength range, in the decorative ply the "color" property of the decorative ply in the visual wavelength range may be separated from desired properties of the decorative ply for the structuring of the resist layer, e.g., sensitive in near-UV, and hence of the at least one layer to be structured. In this way, a high contrast can be achieved between the first and second regions, independently of the visually perceptible coloration of the decorative ply.

It is possible for the carrier ply to be formed as a single-layer or multilayer carrier film. A carrier film thickness for the multilayer element of the invention in the range from 12 to 100 μm has been found appropriate. An example of material contemplated for the carrier film includes PET, but also other polymeric materials, such as PEN (polyethylene naphthalate) or PMMA (polymethyl methacrylate). It is possible for one or more functional layers, more particularly a detachment layer and/or a protective coating layer, to be disposed directly on the first side of the carrier ply.

BRIEF DESCRIPTION OF THE DRAWINGS

The invention is elucidated by way of example by the drawings, in which.

DETAILED DESCRIPTION OF THE INVENTION

FIGS. 1*a* to 14 are drawn each schematically and not to scale, in order to ensure a clear representation of the key features.

Figure 8A:
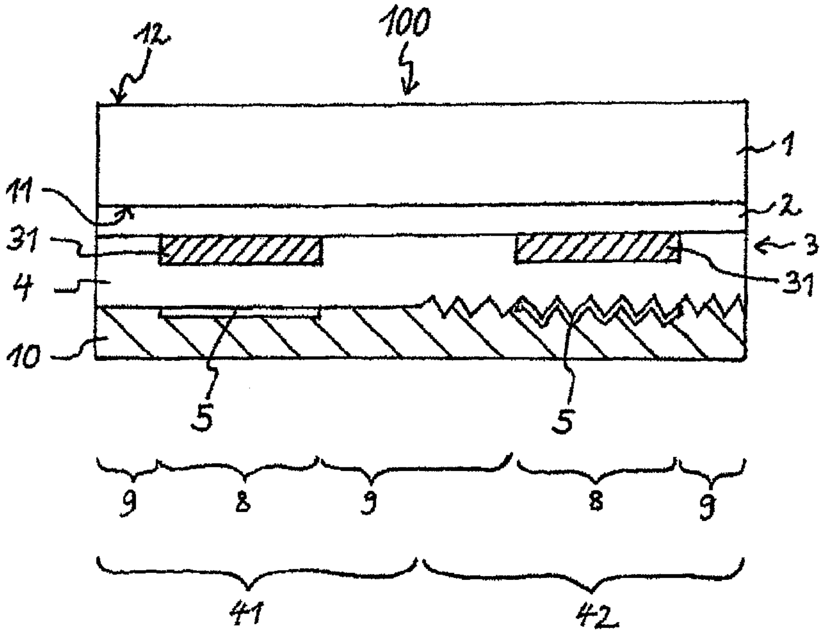
FIG. 8*a* shows a schematic section through a first exemplary embodiment of an inventive multilayer element, formed using a positive resist.

FIG. 8*a* shows a multilayer element 100, which comprises a carrier ply 1 having a first side 11 and a second side 12, a functional layer 2 disposed on the first side 11 of the carrier ply 1, a decorative ply 3 disposed on the functional layer 2 and having a first coating layer 31 formed in a first region 8, a replicating layer 4 adjoining the decorative layer 3, a structured layer 5 disposed on the replicating layer 4 and in register with the first coating layer 3, and compensating layer 10 disposed on the replicating layer 4 and the structured layer 5.

The carrier ply 1 comprises a preferably transparent polymeric film with a thickness of between 8 μm and 125 μm, preferably in the range from 12 to 50 μm, more preferably in the range from 16 to 23 μm. The carrier film 1 may be formed as a mechanically and thermally stable film made of a translucent material, e.g. of ABS (acrylonitrile-butadiene-styrene), BOPP (biaxially oriented polypropylene), PEN or PC, but preferably of PET. This carrier film 1 may be monoaxially or biaxially oriented. Furthermore, it is also possible for the carrier film 1 to consist not of just one layer but instead of two or more layers. Thus it is possible, for example, for the carrier film 1 to have a detachment layer as well as a polymeric carrier, for example, a polymeric film as described above, said detachment layer allowing the detachment of the layer structure consisting of the layers 2 to 6 and 10 from the polymeric film, as for example when the multilayer element 100 is used as a hot-stamping foil.

The functional layer 2 may comprise a detachment layer, made of hot-melting material, for example, which facilitates detachment of the carrier film 1 from the layers of the multilayer element 100 which are disposed on a side of the detachment layer 2 that is remote from the carrier film 1. This is especially advantageous if the multilayer element 100 is designed as a transfer ply, as employed, for example, in a hot-stamping process or an IMD process. It has been found appropriate, moreover, especially if the multilayer element 100 is used as a transfer film, for the functional layer 2 to have a protective layer, e.g., a protective coating layer, as well as a detachment layer. After the multilayer element 100 has been joined to a substrate and after the transfer film 1 has been detached from the layers of the multilayer element 100 which are disposed on a side of the detachment layer 2 that is remote from the carrier film 1, the protective layer forms one of the upper layers of the layers disposed on the surface of the substrate, and is able to protect underlying layers from abrasion, damage, chemical attacks or the like. The multilayer element 100 may be a section of a transfer film, as for example of a hot-stamping foil, which can be disposed on a substrate by means of an adhesive layer. The adhesive layer is preferably disposed on the side of the compensating layer 10 that is remote from the carrier film 1. The adhesive layer may be a hotmelt adhesive, which melts on thermal exposure and joins the multilayer element 100 to the surface of the substrate.

When the multilayer element 100 is formed as a laminating film, i.e., without a detachment layer for detaching the carrier film 1 from the layers of the multilayer element 100, it is possible, additionally or alternatively to the adhesive layer, for a further carrier film to be provided on the side of the compensating layer 10 that is remote from the carrier film 1. This laminate element, consisting of two outside carrier films and the inside layers of the multilayer element 100, may be used further by being laminated into card assemblies, for example, made of PC, for example. For this purpose it is advantageous if the carrier films are made of the same material as the card assembly layers that adjoin the laminate element—for example, likewise made of PC.

On the functional layer 2, in the region 8, a transparent, colored coating layer 31 is printed. Transparent means that the coating layer 31 is at least partly pervious to radiation in the visible wavelength range. Colored means that the coating layer 31 exhibits a visible color impression when there is sufficient daylight.

Not only the regions 8 printed with the coating layer 31 but also the unprinted regions 9 of the functional layer 2 are covered by a replicating layer 4 which evens out the relief structure of the decorative ply 3, i.e., the differing levels in the printed regions 8 and unprinted regions 9. In a second zone, zone 42, the replicating layer 4 has a relief structure which is not present in a first zone, zone 41. Disposed on the replicating layer 4, in register and congruent with the coating layer 31 when viewed perpendicular to the plane of the carrier ply 1, is a thin metal layer 5. Not only the regions 8 of the replicating layer 4 that are covered with the metal layer 5 but also the uncovered regions 9 of the replicating layer 4 are covered with a compensating layer 10, which evens out the structures (e.g., relief structure 42, different layer thicknesses, height offset) brought about by the relief structure 42 and by the regionally 8 disposed metal layer 5—that is, it covers and fills them, so that the multilayer element, on the side of the compensating layer 10 that is remote from the carrier film 1, has a planar, substantially structureless surface. Where the refractive index of the compensating layer 10 is similar to that of the replicating layer 4, i.e., the refractive index difference is less than about 0.3, those regions of the relief structure 42 that directly adjoin the compensating layer 10 and are not covered by the metal layer 5 are optically extinguished in the replicating layer 4, since there, on account of the similar refractive index of the two layers, there are no longer any optically detectable layer boundaries between the replicating layer 4 and the compensating layer 10.

FIGS. 1*a* to 7*a* now show manufacturing stages of the multilayer element 100 shown in FIG. 8*a*. Components identical to those in FIG. 8*a* are given the same reference numerals.

Figure 1A:
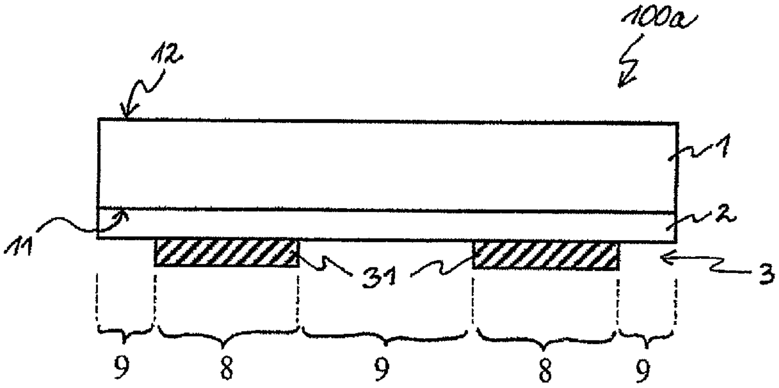
FIG. 1*a* shows a schematic section through a first manufacturing stage of the multilayer element shown in FIG. 8*a;*

FIG. 1*a* shows a first manufacturing stage 100*a* of the multilayer element 100, in which a functional layer 2 and a decorative ply 3 are disposed on a first side 11 of a carrier film 1. One side of the functional layer 2 adjoins the carrier film 1; its other side adjoins the decorative ply 3. The decorative ply 3 has a first region 8, in which a coating layer 31 is formed, and a second region 9, in which the coating layer 31 is absent. The coating layer 31 is printed on the functional layer 2, by screen, gravure or offset printing, for example. As a result of the regional formation—that is, the formation confined to the first region 8—of the coating layer 31, the decorative ply 3 is given a patterned design.

Figure 1B:
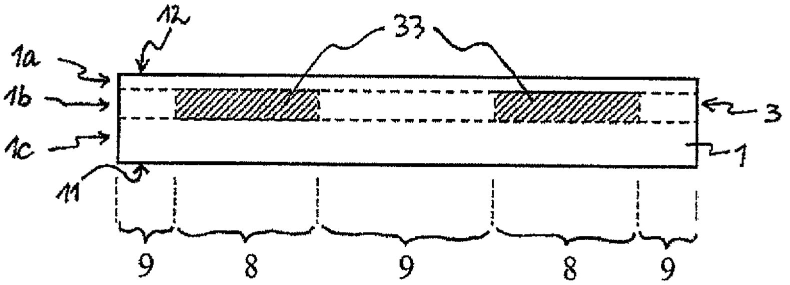
FIGS. 1*b-c* show schematic sections through two alternative embodiments of a first manufacturing stage.
Figure 1C:
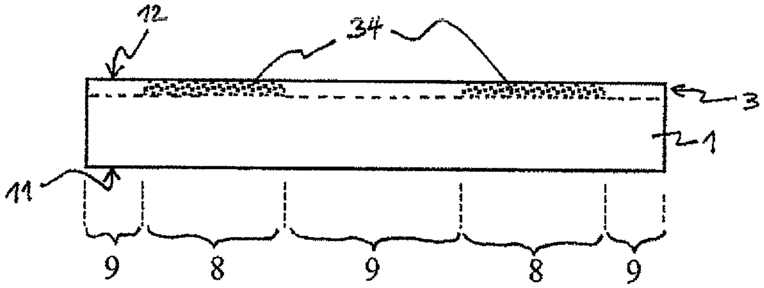
Figure 1D:
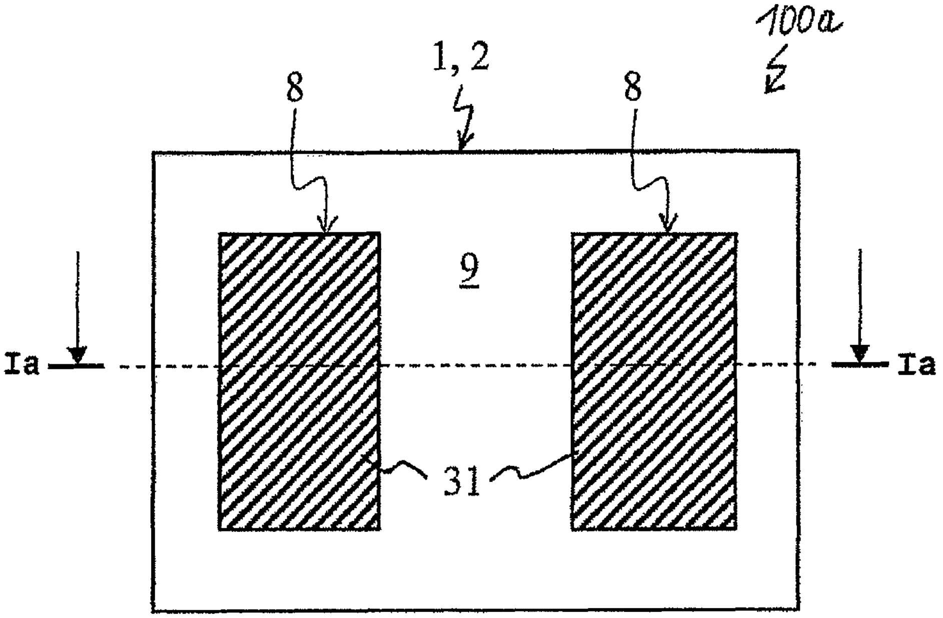
FIG. 1*d* shows a schematic plan view of the first manufacturing stage shown in FIG. 1*a;*

FIG. 1*d* shows a plan view of the first manufacturing stage 100*a*, shown in FIG. 1*a*, of the multilayer element 100, with a viewing direction perpendicular to the plane of the carrier film 1. Printed on the functional layer 2, disposed over the full area of the carrier film 1, in the first region 8 is the coating layer 31, while the second region, region 9, of the functional layer 2 is not printed with the coating layer 31, i.e., is left bare. In the exemplary embodiment shown in FIG. 1*b*, the first region 8 consists of two rectangular areas. As well as geometric patterns of this kind, the first region 8, provided with the coating layer 31, may have any desired form, examples being alphanumeric characters, symbols, logos, fine-line patterns, e.g., grids, or ornaments, e.g., guilloches, or geometrical, pictorial or figurative patterns. In FIG. 1*b*, a sectional plane Ia is indicated; when the sectional plane Ia is viewed in the viewing direction indicated by the arrow, the section shown in FIG. 1*a* is produced.

FIG. 1*b* shows an alternative design of a first manufacturing stage of an inventive multilayer element. In contrast to the exemplary embodiment shown in FIG. 1*a*, the decorative ply 3 in the exemplary embodiment shown in FIG. 1*b* is formed not on the carrier film 1 but instead in the carrier film 1. The carrier film 1 consists of three layers, 1*a*, 1*b*, and 1*c*. The two outer layers, 1*a* and 1*c*, consist of PC. The in-between, middle layer, layer 1*b*, consists of a polymeric material, e.g., an additized PC, which on exposure to laser radiation of a particular energy exhibits a color change from a transparent, colorless, first state to a transparent, colored, second state—i.e., what is called laser blackening. The polymeric material remains in the second state, once it has been achieved, even after the laser radiation has been removed. This means that the carrier film 1 is both decorative ply and carrier.

FIG. 1*c* shows another alternative design of a first manufacturing stage of an inventive multilayer element. As in the case of the exemplary embodiment shown in FIG. 1*b*, the decorative ply 3 in the exemplary embodiment shown in FIG. 1*c* is also formed not on the carrier film 1 but instead in the carrier film 1. The carrier film 1 consists of a polymeric material into which dye/color pigments are able to diffuse. For forming the decorative ply 3, the second surface 12 of the carrier film 1 has been contacted in the first region 8 for a particular time period with a substance from which, color pigments are able to diffuse into the carrier film 1. During this time period, a part of these color pigments diffused into the carrier film 1, and so the colored regions 34 were formed with a particular layer thickness. This means that the carrier film 1 is both decorative ply and carrier.

Figure 2:
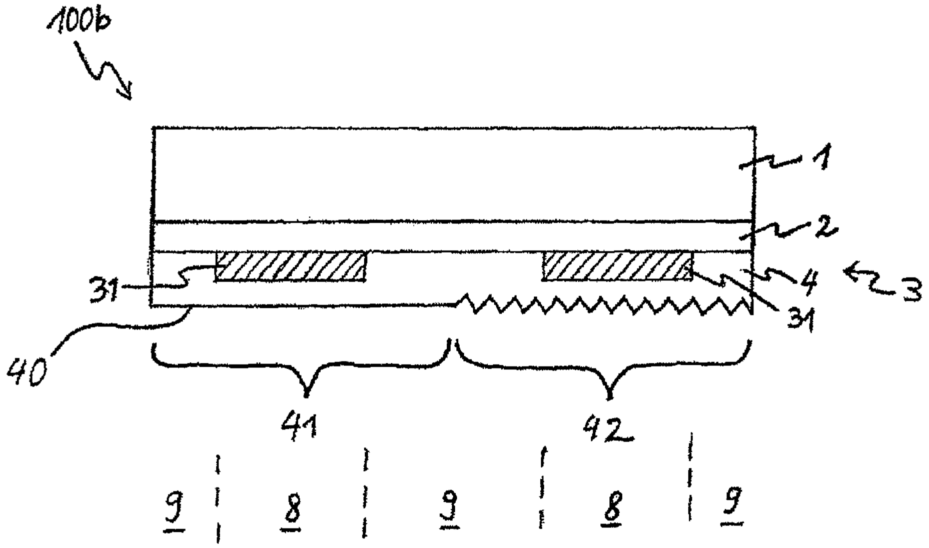
FIG. 2 shows a schematic section through a second manufacturing stage of the multilayer element shown in FIG. 8*a;*

FIG. 2 shows a second manufacturing stage 100*b* of the multilayer element 100 formed from the first manufacturing stage 100*a* in FIG. 1*a* by application of a replicating layer 4 to the functional layer 2 and to the coating layer 31 disposed thereon regionally, i.e., in such a way as to be confined to the first region 8. Said layer 4 may be an organic layer which is applied by conventional coating techniques, such as printing, pouring or spraying, in liquid form. Here, the replicating layer 4 is applied over the full area. The thickness of the replicating layer 4 varies since it compensates/evens out the different levels of the decorative ply 3, comprising the printed, first region and the unprinted, second region 9; in the first region 8, the thickness of the replicating layer 4 is thinner than in the second region 9, and so the side of the replicating layer 4 that is remote from the carrier ply 1 has a planar, substantially structureless surface before the relief structure is formed in the second zone 42. It is, however, also possible for the replicating layer 4 to be applied only in a subregion of the multilayer element 100. The surface of the replicating layer 4 is structured in a second zone 42, by known methods, whereas it is unstructured in a first zone 41. For this purpose, for example, as replicating layer 4, a thermoplastic replicating coating material is applied by printing, spraying or painting, and a relief structure is impressed in the second zone 42 into the replicating coating material 4, which can be dried/cured thermally in particular, by means of a heated die or a heated replicating roller. The replicating layer 4 may also be a UV-curable replicating coating material, which is structured, for example, by a replicating roller and then cured by means of UV radiation. The structuring may alternatively be brought about by UV radiation through an exposure mask. In this way the second zone 42 may be impressed into the replicating layer 4.

Figure 2A:
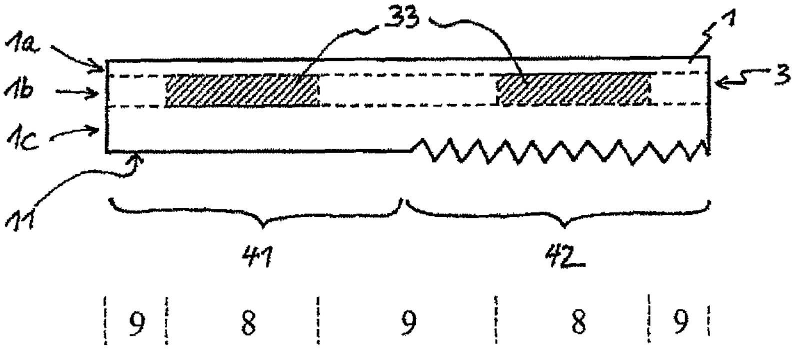
FIG. 2*a* shows a schematic section through an alternative embodiment of a second manufacturing stage.

FIG. 2*a* shows an alternative second manufacturing stage of a multilayer element formed from the first manufacturing stage shown in FIG. 1*b* by the embossing of a relief structure 42 into the first side 11 of the carrier film 1. This means that the carrier film 1 is decorative ply, carrier and replicating layer all at the same time. Of course there are also alternatives possible in which only one relief structure is embossed into the carrier ply 1, but the carrier ply 1 itself does not serve as a decorative ply.

Figure 3:
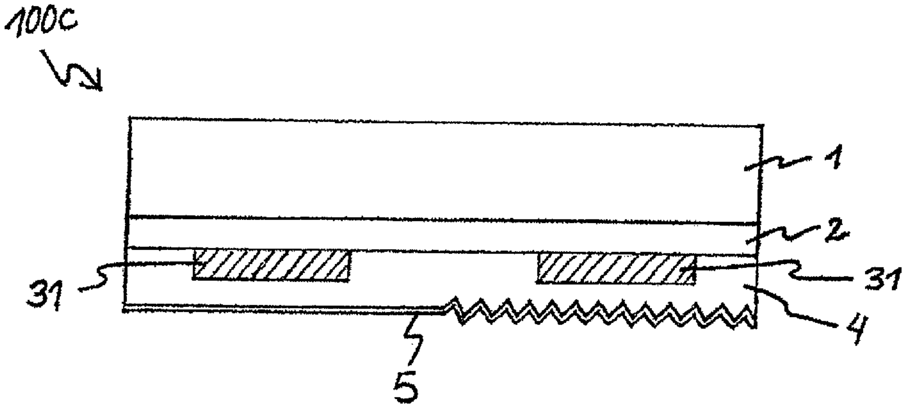
FIG. 3 shows a schematic section through a third manufacturing stage of the multilayer element shown in FIG. 8*a;*

FIG. 3 a third manufacturing stage 100*c* of the multilayer element 100 formed from the second manufacturing stage 100*b* in FIG. 2, by the application to the replicating layer 4 of the layer 5 to be structured. This layer 5 to be structured may be formed, for example, as a metal layer, of silver or aluminum, for example, which is applied by vapor deposition. The application of the layer to be structured here is over the entire area. It is also possible, however, for application to be envisaged only in a subregion of the multilayer element 100, with the assistance, for example, of a regionally shielding vapor deposition mask.

Figure 4:
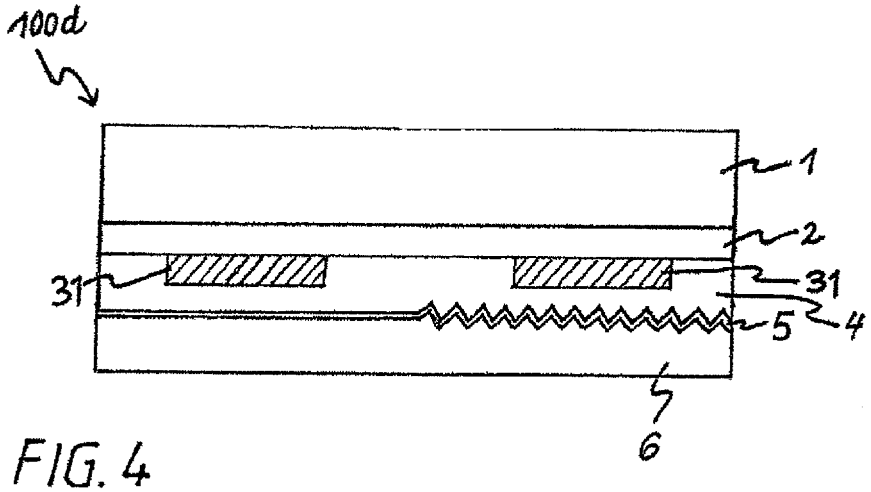
FIG. 4 shows a schematic section through a fourth manufacturing stage of the multilayer element shown in FIG. 8*a;*

FIG. 4 shows a fourth manufacturing stage 100*d* of the multilayer element 100 formed from the third manufacturing stage 100*c* in FIG. 3, by the application to the layer 5 to be structured of a photoactivatable resist layer 6. In the present exemplary embodiment, the resist layer 6 is formed as a positive resist, i.e., as a resist in which the more strongly exposed (i.e., activated) regions are dissolved following exposure. The resist layer 6 may be an organic layer applied by conventional coating techniques, such as printing, pouring or spraying, in liquid form. Provision may also be made for the resist layer 6 to be applied by vapor deposition or to be laminated on as a dry film.

The photoactivatable layer 6 may be, for example, a positive photoresist BAZ 1512 or AZ P 4620 from Clariant or S1822 from Shipley, which is applied to the layer 5 to be structured in a density per unit area of 0.1 $g/m^2$ to 10 $g/m^2$, preferably of 0.1 $g/m^2$ to 1 $g/m^2$. The layer thickness is guided by the desired resolution and by the operation. Application here is envisaged over the entire area. Also possible, however, is application only in a subregion of the multilayer element 100.

Figure 5:
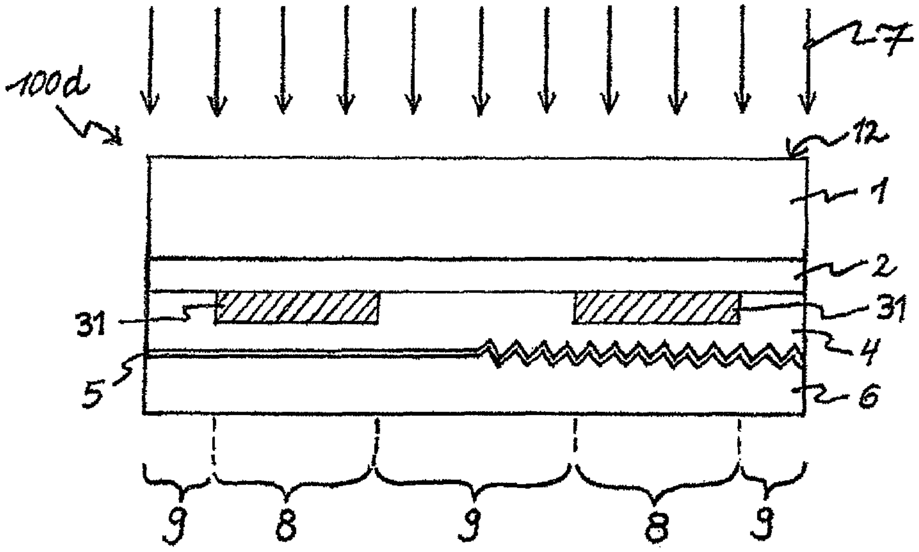
FIG. 5 shows a schematic section through a fifth manufacturing stage of the multilayer element shown in FIG. 8*a;*

FIG. 5 shows a fifth manufacturing stage 100*d* of the multilayer element 100, in which the multilayer element 100, present after the fourth manufacturing stage 100*d*, is irradiated. Electromagnetic radiation 7, having a wavelength suitable for activating the photoactivatable resist layer 6, is radiated from the second side 12 of the carrier film 1, i.e., the side of the carrier film 1 that is opposite the carrier film 1 side coated with the resist layer 6, through the multilayer element 100*d*. The irradiation serves for activating the photoactivatable resist layer 6 in the second region 9, in which the decorative ply 3 has a higher transmittance than in the first region 8. The strength and duration of the exposure with the electromagnetic radiation 7 is tailored to the multilayer element 100*e* in such a way that in the second region 9 the radiation causes activation of the photoactivatable resist layer 6, while in the first region 8 printed with the coating layer 31 it does not cause activation of the photoactivatable resist layer 6. It has been found appropriate if the contrast brought about by the coating layer 31 between the first region 8 and the second region 9 is greater than two. Moreover, it has been found appropriate if the coating layer 31 is designed such that the radiation 7, after passing through the entire multilayer element 100*e*, exhibits a ratio of the transmittances, i.e., a contrast ratio, of approximately 1:2 between the first region 8 and the second region 9.

Figure 6:
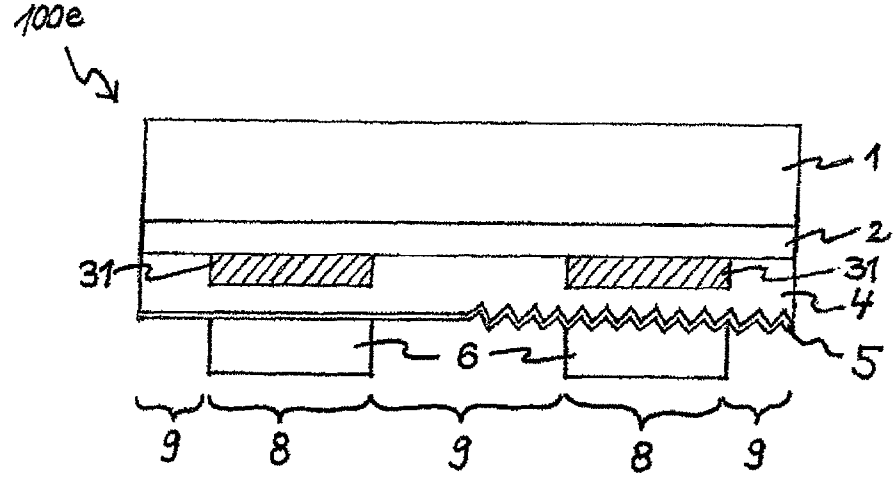
FIG. 6 shows a schematic section through a sixth manufacturing stage of the multilayer element shown in FIG. 8*a;*

FIG. 6 shows a "developed" sixth manufacturing stage 100*e* of the multilayer element 100 formed from the fifth manufacturing stage 100*d* in FIG. 5, by the action of a developer solution, e.g., solvents or alkalis, more particularly a sodium carbonate solution or a sodium hydroxide solution, having taken place on the surface of the exposed photoactivatable resist layer 6 that is remote from the carrier film 1. As a result of this, the exposed resist layer 6 has been removed in the second region 9. In the first region 8, the resist layer 6 is intact, since the amount of radiation absorbed in these regions has not led to sufficient activation. As already mentioned, therefore, the resist layer 6 is formed from a positive photoresist in the exemplary embodiment shown in FIG. 6. With a photoresist of this kind, the more strongly exposed regions 9 are soluble in the developer solution, e.g., in the solvent. In the case of a negative photoresist, in contrast to this, the unexposed or less strongly exposed regions 8 are soluble in the developer solution, as set out below in the exemplary embodiment shown in FIG. 9.

Figure 7:
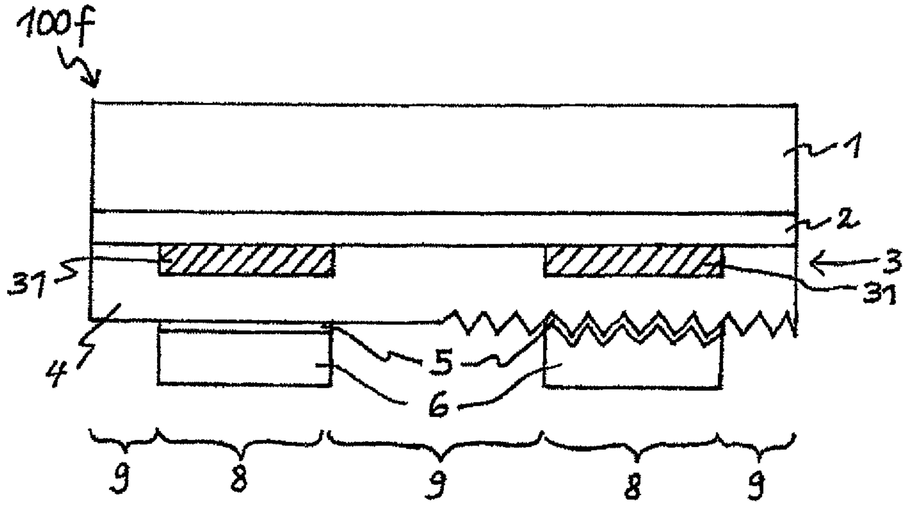
FIG. 7 shows a schematic section through a seventh manufacturing stage of the multilayer element shown in FIG. 8*a;*

FIG. 7 shows a seventh manufacturing stage 100*f* of the multilayer element 100 formed from the sixth manufacturing stage 100*e* in FIG. 6, by the removal of the layer 5 to be structured in the second region 9 by means of an etchant. This is possible by virtue of the fact that, in the second region 9, the layer 5 to be structured is not protected against the attack of the etchant by the developed resist layer 6, which acts as an etch mask. The etchant may be, for example, an acid or an alkali. In this way, the regions of the structured layer 5 that are shown in FIG. 7 are formed.

Figure 7A:
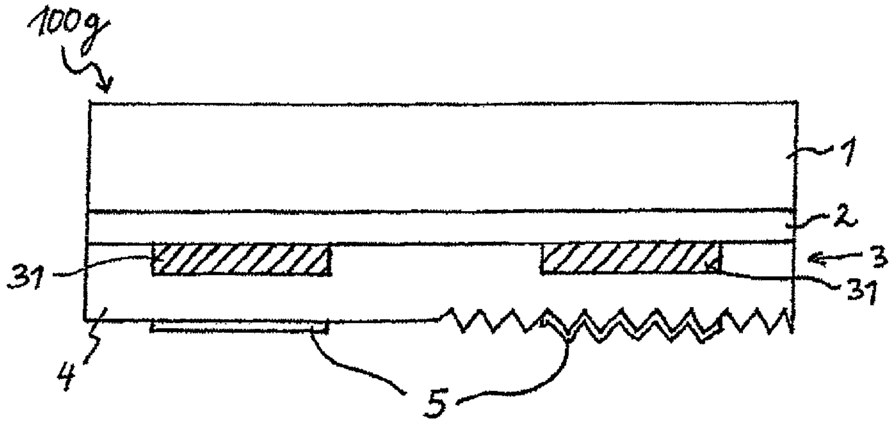
FIG. 7*a* shows a schematic section through an eighth manufacturing stage of the multilayer element shown in FIG. 8*a;*

FIG. 7*a* shows an eighth manufacturing stage 100*g* of the multilayer element 100 formed from the seventh manufacturing stage 100*f* in FIG. 7, by further removal, likewise, of the regions of the resist layer 6 that remained intact (this removal being referred to as "stripping"). Generally speaking, the resist of the resist layer 6 has only low chemical stability, since it must be amenable to attack by the developer solution in the present method. If the intact regions of the resist layer 6 were left on the multilayer element, therefore, it would be possible for the intact regions of the resist layer 6 to have weakened the stability and resistance of the security element, in the case, for example, of a counterfeiting attack on the multilayer element using solvents or acids or alkalis. As a result of the complete removal of the resist layer 6, therefore, this disadvantage is avoided. The fact that certain resists have only low chemical stability, i.e., are sensitive, toward solvents, however, may also be exploited to advantage in some cases. Following application of the multilayer element 100 to a substrate, more particularly to the surface of a security document, the resist is washed off by means of solvent, together with a dye that colors the resist, in the event of attempted manipulations. The attempted manipulation is made visible by a change in the coloredness of the resist.

In this way, therefore, the layer 5 to be structured can be structured in register with the first and second regions 8 and 9 defined by the coating layer 31 without additional technical cost and complexity. In conventional methods for producing an etch mask by means of mask exposure, the mask being present either as a separate unit, e.g., as a separate film or as a separate glass plate/glass roller, or in the form of a layer applied subsequently by printing, the problem occurs that linear and/or nonlinear distortions in the multilayer element 100, brought about by prior operating steps, more particularly those involving thermal and/or mechanical stress, as for example when the replicating structure 42 is produced in the replicating layer 4, cannot be compensated entirely over the entire area of the multilayer element 100, despite the fact that mask orientation takes place to register marks that are present in disposition preferably on the horizontal and/or vertical edges of the multilayer element. The tolerance here fluctuates within a comparatively large range over the entire area of the multilayer element 100.

With the method of the invention, the first and second regions 8 and 9 defined by the coating layer 31 are utilized as a mask, with the coating layer 31 being applied in an early operational step in the production of the multilayer element 100 as described above. As a result of this, there can be no additional tolerances and also no additional tolerance fluctuations over the area of the multilayer element 100, since the subsequent generation of a mask and the resultant requirement for extremely in-register subsequent positioning of this mask independent of the operational profile so far are avoided. The tolerances and register accuracies in the case of the method of the invention have their basis only in the not absolutely precise profile of the color edge of the first and second regions 8 and 9, defined by the coating layer 31, the quality of these regions being determined by the printing technique employed in each case, and are situated, for instance, in the micrometer range, and hence well below the resolution capacity of the eye; in other words, the naked human eye is no longer able to perceive tolerances present.

The multilayer element 100 shown in FIG. 8*a* is formed from the manufacturing stage 100*g* of the multilayer element 100, shown in FIG. 7*a*, by the application of a compensating layer 10 to the exposed structured layer disposed in the first region 8 and also to the replicating layer 4 disposed in the second region 9, and exposed by removal of the layer 5 to be structured and of the photoresist layer 6. Here, the compensating layer 10 is applied over the full area.

It is possible for the compensating layer 10 to be applied in a different layer thickness in each of the first and second regions 8 and 9 respectively, by means of knifecoating, printing or spraying, for example, so that the compensating layer 10 has a planar, substantially structureless surface on its side remote from the carrier ply 1. The layer thickness of the compensating layer 10 varies, since it compensates/evens out the different levels of the structured layer 5 disposed in the first region 8, and the replicating layer 4 exposed in the second region 9. In the second region 9, the thickness of the compensating layer 10 is selected greater than the thickness of the structured layer 5 in the first region 8, and so the side of the compensating layer 10 that is remote from the carrier ply 1 has a planar surface. Also possible, however, is the application of the compensating layer 10 only in a subregion of the multilayer element 100. It is possible for one or more further layers, such as an adhesion layer or adhesive layer for example, to be applied to the planar compensating layer 10. In an advantageous way it is also possible for the adhesion layer or adhesive layer to take on the level-compensating effect of the compensating layer 10, with the consequence that there is no need for a separate compensating layer 10.

Figure 8B:
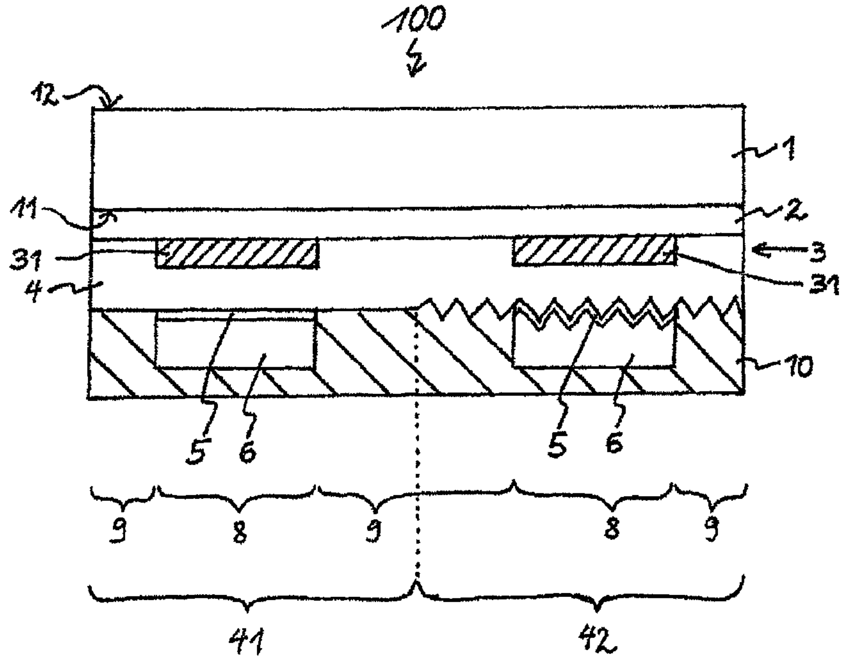
FIG. 8*b* shows a schematic section through an alternative exemplary embodiment of a multilayer element of the invention.

FIG. 8*b* shows an alternative design of the multilayer element 100 shown in FIG. 8*a*, formed from the manufacturing stage 100*f* of the multilayer element 100, shown in FIG. 7*a*, by the application of a compensating layer 10 to the regions of the resist layer 6 that were retained in the first region 8, and also to the replicating layer 4 disposed in the second region 9 and exposed by removal of the layer 5 to be structured and of the photoresist layer 6. In contrast to the multilayer element 100 shown in FIG. 8*a*, therefore, the multilayer body shown in FIG. 8*b* comprises the retained regions of the resist layer 6.

Figure 9:
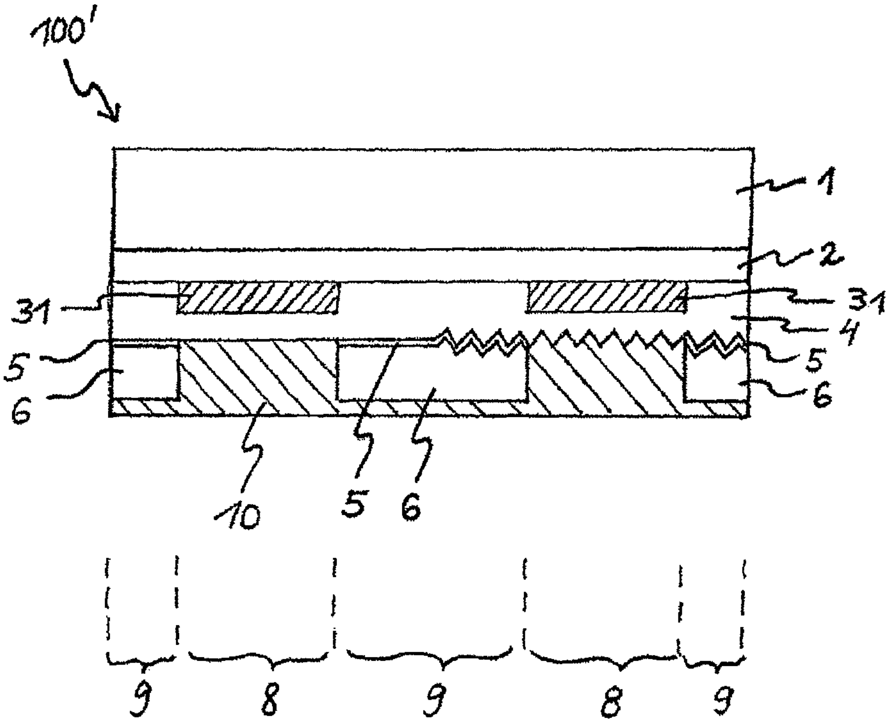
FIG. 9 shows a schematic section through a further exemplary embodiment of an inventive multilayer element, formed using a negative resist.

FIG. 9 shows an alternatively formed multilayer element 100' of the invention, in which, in contrast to the multilayer element 100 shown in FIG. 8, a negative resist layer 6 rather than a positive resist layer 6 has been used. As a result, the structured layer 5 and the resist layer 6 are disposed not like the coating layer 31 in the first region 8, but instead in the second region 9. The structured layer 5 and the resist layer 6 of the alternative multilayer element 100' are indeed disposed in register with the regional boundaries of the regions 8, 9 of the coating layer 31, like the multilayer element 100 shown in FIG. 8, but are not disposed congruently with the coating layer 31, but instead are disposed in the unprinted interstices 9 of the coating layer 31.

Figure 10:
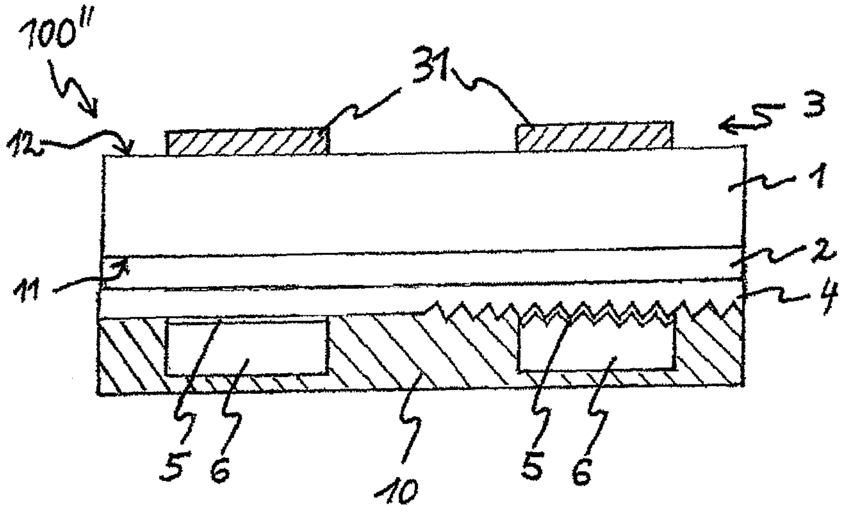
FIG. 10 shows a schematic section through a further exemplary embodiment of a multilayer element of the invention.
Figure 11:
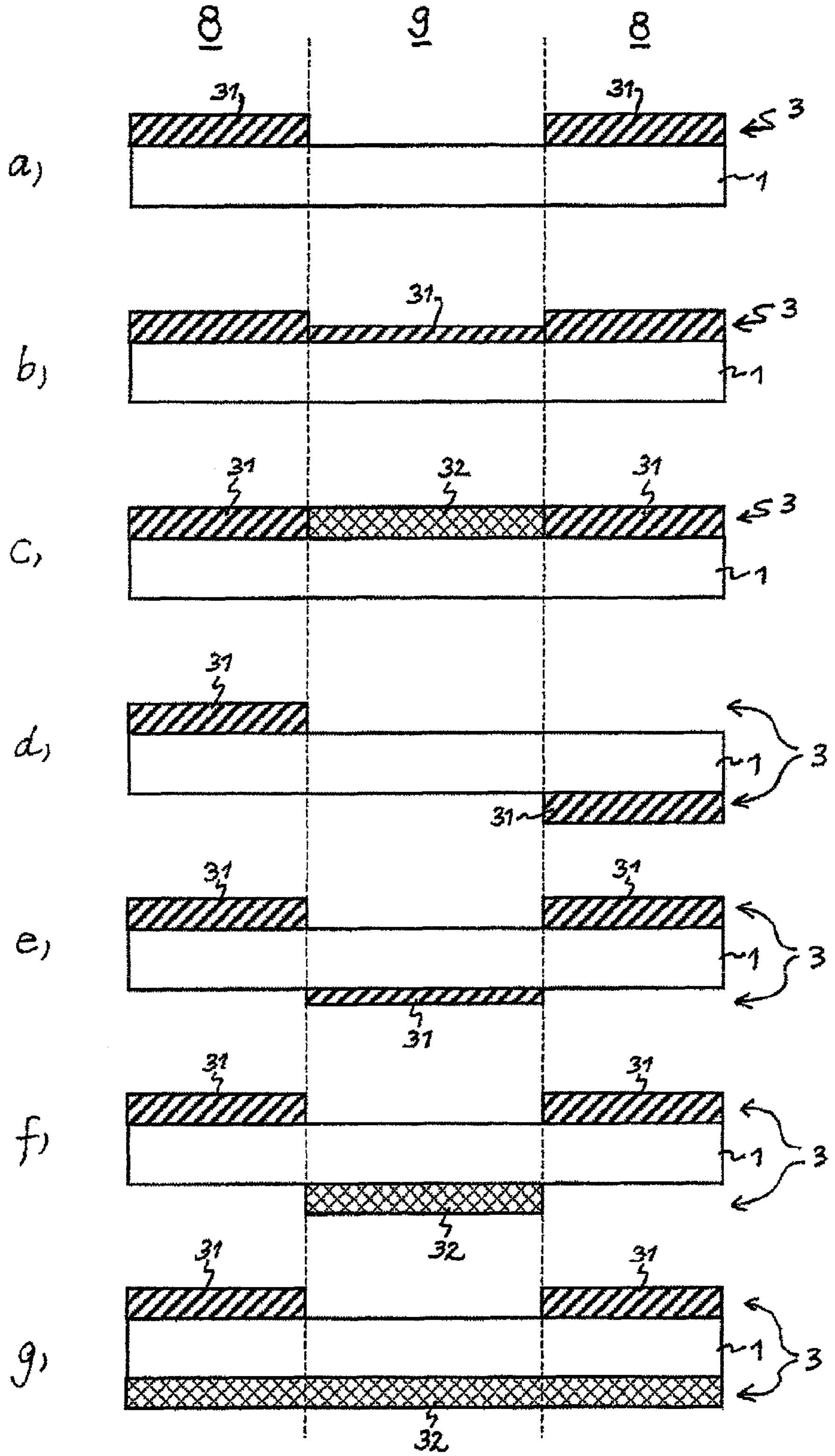
FIGS. 11*a-g* show schematic representations of possible designs of the decorative ply.

FIG. 10 shows a multilayer element 100'', in which the decorative ply 3 consists of a regionally formed coating layer 31, which is disposed on the second side 12 of the carrier film 1, with the second side 12 being opposite the first side 11 of the carrier film 1, on which the structured layer 5 is disposed.

FIG. 11*a* to FIG. 11*g* show in schematic representation different inventive designs of the decorative ply 3. Shown in each case is a carrier film 1 having a bottom side and a top side, on which is disposed a decorative ply 3 comprising a first region 8 and/or a second region 9 in different dispositions. In all of the designs shown, the top side may be either the first side or the second side of the inventive multilayer element.

When reference is made below to a "first coating layer" and a "second coating layer", what this means is that there are two differently formed coating layers, with, for example, different optical properties such as color and/or different mechanical properties such as elasticity modulus, having different transmittances. Two first coating layers, explicitly described as having a different layer thickness from one another, likewise have a different transmittance. Absent an explicit description to the effect that two layer elements of a first coating layer have differing layer thicknesses, the assumption shall be that they are of equal thickness and have the same transmittance.

FIG. 11*a* shows the version already depicted in FIG. 10, in which the decorative ply 3 consists of a first coating layer 31 which is disposed in the first region on the top side of the carrier film 1 and is not present in the second region 9.

FIG. 11*b* shows a version in which the decorative ply 3 consists of a first coating layer 31 disposed over the full area of the top side of the carrier film 1 and having a greater thickness in the first region 8 than in the second region 9.

FIG. 11*c* shows a version in which the decorative ply 3 consists of a first coating layer 31 disposed in the first region 8 on the top side of the carrier film 1, and of a second coating layer 32 disposed in the second region 9 likewise on the top side of the carrier film 1. The coating layers 31 and 32 may, for example, be two different colored coating layers or two coating layers each having different optical effects.

FIG. 11*d* shows a version in which the decorative ply 3 consists of a first coating layer 31 which is disposed in the first region 8 and which is not present in the second region 9. The first coating layer comprises two layer components, a first layer component being disposed on the top side of the carrier film 1 and a second layer component being disposed on the bottom side of the carrier film 1.

FIG. 11*e* shows a version in which the decorative ply 3 from a first coating layer 31 which is disposed in the first region 8 on the top side of the carrier film 1 and has a first thickness, and from a first coating layer 31 which is disposed in the second region 9 on the bottom side of the carrier film 1 and has a second thickness, which is lower than the first thickness.

FIG. 11*f* shows a version in which the decorative ply 3 consists of a first coating layer 31, which is disposed in the first region 8 on the top side of the carrier film 1, and of a second coating layer 32, which is disposed in the second region 9 on the bottom side of the carrier film 1.

FIG. 11g shows a version in which the decorative ply 3 consists of a first coating layer 31, which is disposed in the first region 8 on the top side of the carrier film 1, and of a second coating layer 32, which is disposed over the full area of the bottom side of the carrier film 1.

Figure 12:
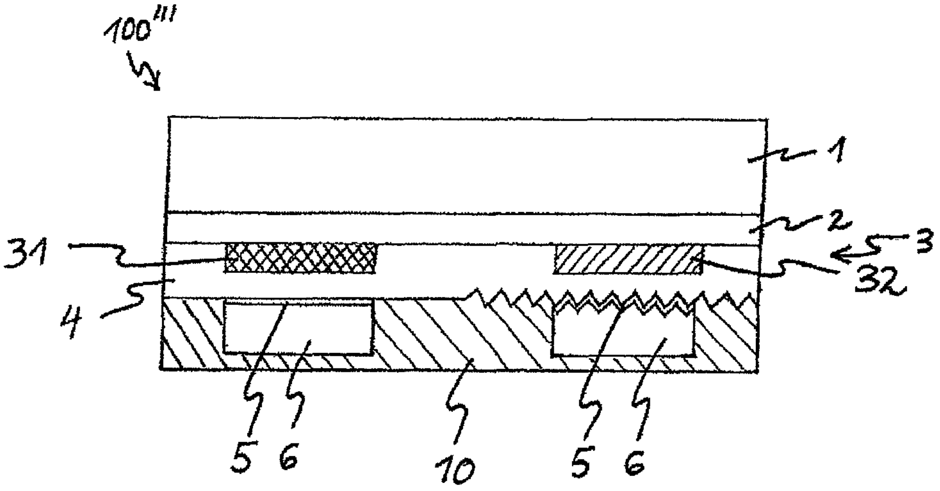
FIG. 12 shows a schematic section through a further exemplary embodiment of a multilayer element of the invention.

FIG. 12 shows a multilayer element 100''', in which the decorative ply 3 is formed by a first coating layer 31, which generates a first color impression, and a second coating layer 32, which generates a second color impression, both coating layers 31, 32 being disposed on the same side of the carrier ply 1 between the functional layer 2 and the replicating layer 4.

Figure 13:
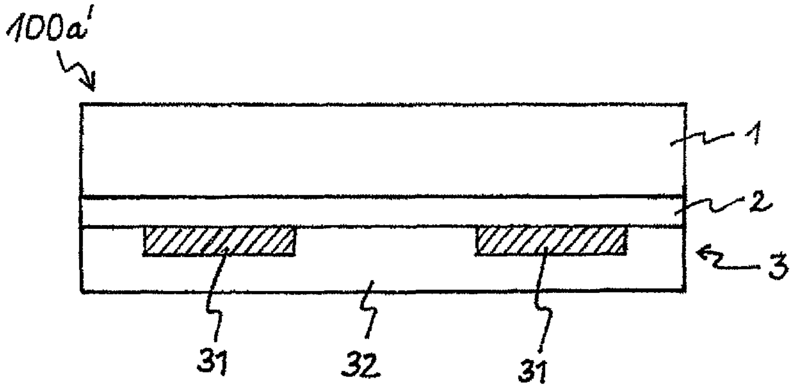
FIG. 13 shows a schematic section through a manufacturing stage of a multilayer element.

FIG. 13 shows a multilayer element 100*a*' in which the decorative ply 3 is formed from a first, regionally applied coating layer 31 and from a second coating layer 32, applied over the full area of said first layer 31, with both coating layers 31, 32 being disposed on the same side of the carrier ply 1.

Figure 14:
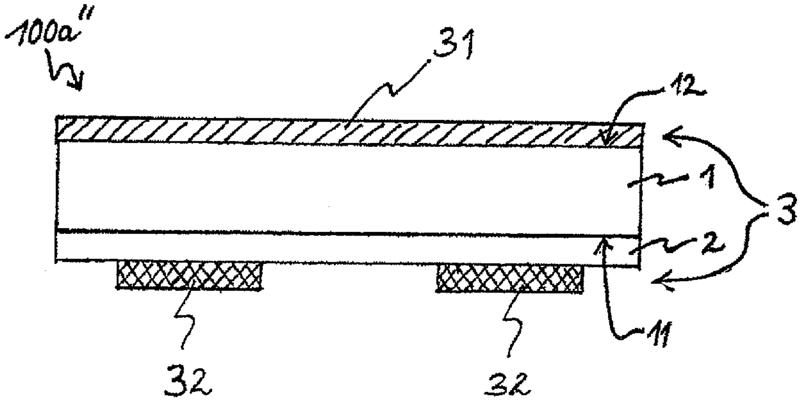
FIG. 14 shows a schematic section through a further manufacturing stage of a multilayer element.

FIG. 14 shows a multilayer element 100*a*'', in which the decorative ply 3 consists of a first coating layer 31, which is applied over the full area of the second side 12 of the carrier film 1, and of a second coating layer 32, which is applied regionally on the first side 11 of the carrier film 1.

Figure 15:
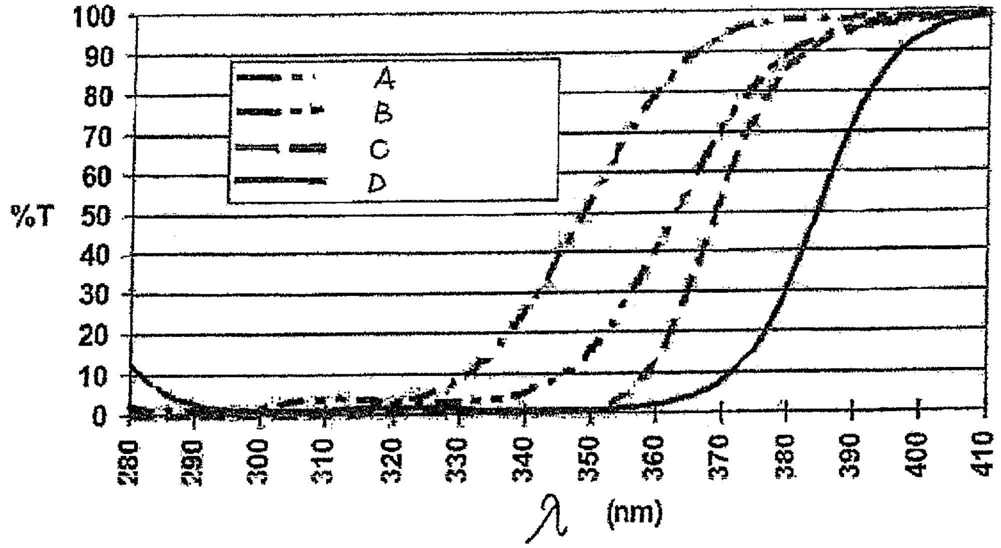
FIG. 15 shows transmission spectra of different UV absorbers.

FIG. 15 shows transmission spectra of four different classes of UV absorbers which may be present in the first region 8 of the decorative ply 3, in order to form a different transmittance in the first region 8 and in the second region 9. The UV absorbers are present at a concentration of 0.00014 mol/l in chloroform. The plot shows the transmittance % T, measured as a percentage, over the wavelength λ in the range from 280 to 410 nm. The dash-dot line A shows the transmission of oxalanilide, the dash-dot-dot line B the transmission of hydroxybenzophenone, the dash-dash line C the transmission of hydroxyphenyl-S-triazine, and the continuous line D the transmission of benzotriazole.

LIST OF REFERENCE NUMERALS

1 carrier ply
1*a*, 1*b*, 1*c* layers (of 1)
2 functional layer
3 decorative ply
4 replicating layer
5 layer to be structured, or structured layer
6 resist layer
7 radiation
8 first region
9 second region
10 compensating layer
11 first side (of 1)
12 second side (of 1)
31 first coating layer (of 3)
32 second coating layer (of 3)
33, 34 coloration
40 surface (of 4)
41 first zone, unstructured (of 4)
42 second zone, structured (of 4)
100 multilayer element

The invention claimed is:

1. A method for producing a multilayer element, where a) on and/or in a carrier ply having a first side and a second side, a single-layer or multilayer decorative ply having a first region and a second region is formed, the decorative ply, viewed perpendicular to the plane of the carrier ply, having in the first region, a first transmittance and in the second region a second transmittance greater in comparison to the first transmittance, said transmittances relating to electromagnetic radiation having a wavelength suitable for photoactivation, b) at least one layer to be structured is disposed on the first side of the carrier ply, c) a resist layer which can be photoactivated by means of said electromagnetic radiation is disposed on the first side of the carrier ply in such a way that the resist layer is disposed on the side of the at least one layer to be structured that is remote from the carrier ply, and the decorative ply is disposed on the other side of the at least one layer to be structured, d) the resist layer is exposed from the second side of the carrier ply by means of said electromagnetic radiation, the decorative ply serving as an exposure mask through the design of the first region and of the second region, and e) the at least one layer to be structured and the resist layer are structured in register with one another by means of structuring operations synchronized with one another.

2. The method as claimed in claim 1, wherein the decorative ply comprises a first coating layer which is disposed in the first region with a first layer thickness and in the second region either not or with a second layer thickness smaller in comparison to the first layer thickness on the carrier ply, so that the decorative ply has said first transmittance in the first region and said second transmittance in the second region.

3. The method as claimed in claim 1 wherein the decorative ply comprises a first coloration of the carrier ply, which is formed in the first region with a first layer thickness and in the second region either not or with a second layer thickness smaller in comparison to the first layer thickness, so that the decorative ply has said first transmittance in the first region and said second transmittance in the second region.

4. The method as claimed in claim 1, wherein the layer thickness and the material of the decorative ply are selected such that the first transmittance is greater than zero.

5. The method as claimed in claim 1, wherein the thickness and the material of the decorative ply are selected such that the ratio between the second transmittance and the first transmittance is greater than two.

6. The method as claimed in claim 1, wherein a detachment layer and/or a protective coating layer, is disposed between the carrier ply and the at least one layer to be structured.

7. The method as claimed in claim 6, wherein the thickness and the material of the decorative ply are selected such that the electromagnetic radiation, measured after passage through a layer stack consisting of the carrier ply, the at least one functional layer and the decorative ply, has a transmittance of around 0.3 in the first region and a transmittance of around 0.7 in the second region.

8. The method as claimed in claim 1, wherein on the first side of the carrier ply, at least one relief structure is formed, and wherein the at least one layer to be structured is disposed on the surface of the at least one relief structure.

9. The method as claimed in claim 8, wherein a replicating layer is disposed on the first side of the carrier ply, and wherein the at least one relief structure is embossed into a surface of the replicating layer that is remote from the carrier ply.

10. The method as claimed in claim 8, wherein the at least one relief structure is embossed into the carrier ply.

11. The method as claimed in claim 8, wherein the at least one relief structure is disposed at least partly in the first region and/or in the second region.

12. The method as claimed in claim 1, wherein, after step e), a compensating layer is applied on the first side of the carrier ply.

13. The method as claimed in claim 1, wherein at least one layer of the decorative ply is applied on the second side of the carrier ply.

14. The method as claimed in claim 13, wherein the at least one layer of the decorative ply that is applied on the second side of the carrier ply is removed from the carrier ply after exposure step d).

15. The method as claimed in claim 1, wherein the photoactivatable layer is formed using a positive photoresist whose solubility increases on activation by exposure, or a negative photoresist whose solubility decreases on activation by exposure, and wherein the resist layer is removed in the second region when a positive photoresist is used or is removed in the first region when a negative photoresist is used.

16. The method as claimed in claim 15, wherein the layer to be structured is removed in the first or second region in which the resist layer has been removed.

17. The method as claimed in claim 1, wherein UV radiation is used for exposure step d).

* * * * *

UNITED STATES PATENT AND TRADEMARK OFFICE

CERTIFICATE OF CORRECTION

PATENT NO. : 8,691,493 B2
APPLICATION NO. : 13/383635
DATED : April 8, 2014
INVENTOR(S) : Brehm et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 159 days.

Signed and Sealed this
Twenty-ninth Day of September, 2015

Michelle K. Lee

Michelle K. Lee
*Director of the United States Patent and Trademark Office*